United States Patent
Yamada et al.

(10) Patent No.: US 9,195,130 B2
(45) Date of Patent: Nov. 24, 2015

(54) PELLICLE FOR EUV

(71) Applicant: SHIN-ETSU CHEMICAL CO., LTD., Chiyoda-Ku, Tokyo (JP)

(72) Inventors: Motoyuki Yamada, Annaka (JP); Shoji Akiyama, Annaka (JP)

(73) Assignee: Shin-Etsu Chemical Co., Ltd., Chiyoda-Ku, Tokyo ( * ) Notice: Subject to any disclaimer, the term of this patent is extended or adjusted under 35 U.S.C. 154(b) by 197 days.

(21) Appl. No.: 14/016,737

(22) Filed: Sep. 3, 2013

(65) Prior Publication Data
US 2014/0065525 A1    Mar. 6, 2014

(30) Foreign Application Priority Data

Sep. 3, 2012 (JP) ................. 2012-193082

(51) Int. Cl.
G03F 1/64 (2012.01)
G03F 1/62 (2012.01)
G03F 1/22 (2012.01)
G03F 1/00 (2012.01)
G03F 1/24 (2012.01)

(52) U.S. Cl.
CPC ...... G03F 1/22 (2013.01); G03F 1/142 (2013.01); G03F 1/24 (2013.01); G03F 1/62 (2013.01); G03F 1/64 (2013.01)

(58) Field of Classification Search
CPC ................ G03F 1/62; G03F 1/64; G03F 1/22
USPC ................................... 430/5; 428/14
See application file for complete search history.

(56) References Cited

U.S. PATENT DOCUMENTS

| 2008/0124633 A1* | 5/2008 | Nagai et al. ........... 430/5 |
| 2011/0063733 A1* | 3/2011 | Yeo et al. ........... 359/629 |

* cited by examiner

Primary Examiner — Stephen Rosasco
(74) Attorney, Agent, or Firm — Millen, White, Zelano & Branigan, P.C.

(57) ABSTRACT

A pellicle for EUV including a silicon film and a mesh work structure supporting the silicon film, and this pellicle is improved in that the grid frames of the mesh work structure are tapered in such a manner that the width of each grid frame lessens as the distance from the silicon film is increased.

3 Claims, 4 Drawing Sheets

PELLICLE FOR EUV

The present non-provisional patent application claims priority, as per Paris Convention, from Japanese Patent Application No. 2012-193082 filed on Sep. 3, 2012, the disclosure of which is incorporated by reference herein in its entirety.

FIELD OF THE INVENTION

The present invention relates to a pellicle for EUV (Extreme Ultra Violet), and in particular to a pellicle for EUV having a capability of extremely minimizing the attenuation of incoming EUV light while maintaining its physical strength.

BACKGROUND TECHNOLOGY

As semiconductor devices have been highly integrated and progressively densified, a lithographic patterning on the level of 45 nm becomes possible now. Such patterning can be realized by improved technologies such as an immersion exposure method and a double exposure method, which use ArF instead of a conventional excimer light. However, to cope with a next-generation patterning on the level of 32 nm or even thinner, the exposure technology depending on the excimer light falls short, and an EUV exposure technology, which uses EUV light of which the main wavelength is 13.5 nm, far shorter than that of the excimer light, is considered as a promising solution.

Although this EUV exposure technology has been considerably improved toward its practical use, there remain many technical problems to be solved with respect to a light source, a resist, a pellicle, etc. For example, with regard to the pellicle used to prevent an adhesion of a foreign matter to a photomask, which is a phenomenon that lowers production yield, there are various unsolved problems, and thus the pellicle poses a big obstacle against the realization of EUV exposure technology.

An especially difficult problem lies in that there has not been a clear roadmap toward realizing a development of a material to make the transparent film of the pellicle that does not age with oxidation or the like and is thus chemically stable, in addition to having a high transmittance of EUV light.

Conventionally, a material of a pellicle film for EUV has had various problems. In particular, there are various problems in that organic materials hardly transmit an EUV light and also they are decomposed or deteriorated by the EUV light. Although there exists no material that has a perfect transparency in the wavelength range of EUV light, there are disclosed silicon thin films as relatively transparent films for EUV light (U.S. Pat. No. 6,623,893 and Shroff et al. "EUV Pellicle Development for Mask Defect Control," Emerging Lithographic Technologies X, Proc of SPIE VOL. 6151 p.1-10 (2006)).

It is desired that these silicon films for EUV application are as thin as possible from the viewpoint of reducing the attenuation of EUV light. However, these silicon thin films, which are made up of a silicon membrane of 20 nm thickness and a rubidium layer of 15 nm thickness, have thicknesses on nanometer order. Therefore, they are very fragile with regard to strength and it is impossible that they are used on their own as a pellicle film for EUV.

For this reason, in order to solve this difficulty inherent to using such silicon thin film as a pellicle film for EUV, there has been proposed a use of a structure which has a honeycomb-like shape and has openings adapted to pass EUV light and is unified with the extremely thin silicon film to reinforce it.

For example, there is proposed a pellicle for EUV which utilizes an SOI (Silicon On Insulator), and the said pellicle has a mesh structure as a honeycomb-like structure for reinforcement of the pellicle membrane for EUV (Japanese Unexamined Patent Publication 2010-256434).

As a mesh structure for reinforcement of the pellicle film for EUV, one can choose from various shapes besides the above-mentioned honeycomb-like structure so long as the intended purpose is met, such as a lattice structure, a plate-like body having openings in an arbitrary shape such as a circle and a polygon. The strength of the structure is determined by a mesh pitch, a width of the thin grid frame defining each mesh opening, and a height (thickness) of the frame, and the narrower the pitch is, the greater the width of the grid frame is and the greater the height (thickness) of the grid frame is, the greater the strength of the structure is.

Since the EUV light cannot pass this mesh structure other than the opening, the opening ratio of the mesh structure ought to be increased in order that the attenuation of the incoming EUV light is minimized. However, as is described above, if the strength of the pellicle film for EUV is desired to increase, the opening ratio of the mesh structure has to be compromised.

In general, the EUV light emitted from a light source in a stepper focuses after following an optical system of the stepper and describes a desired pattern upon a wafer. However, if the light attenuation caused at the pellicle for EUV in the optical system is large, it would be necessary to incorporate a supplemental technology so as to increase, for example, the light emission strength of the light source or the mirror reflectance, or to increase the sensitivity of the resist put on the wafer. As such, the light attenuation caused by the pellicle for EUV would bring unfavorable consequences to all the constituent elements of the EUV optical system, therefore, it has to be avoided as much as possible.

Now, the chief causes for the attenuation of the EUV light coming through the pellicle for EUV are an absorption of the light by the EUV pellicle film and a blocking of the light by the grid frames of the mesh structure, and the latter is determined by the opening ratio. The opening ratio of the mesh structure is determined by factors such as the width of the grid frame, the mesh pitch and the grid frame height (thickness) etc. forming the mesh structure.

Now, the reason why the mesh height is relevant to the opening ratio of the mesh structure is that, in the EUV stepper, the angle of incidence with which the light passes the pellicle film is 4-6 degrees and thus the greater the frame height is, the greater the amount of the light will be blocked. Hence, depending on the mesh height, the resulting shade is changed.

Accordingly, after due consideration of the above-mentioned respective factors, it has been desired to design a structure wherein, while making every effort to avoid the reduction of the amount of the light that reaches the mask, at the same time, the necessary physical strength of the EUV pellicle can be maintained.

The present inventors studied intensively to find a way to simultaneously achieve (1) withholding the lowering of the physical strength of the pellicle for EUV and (2) suppressing the lowering of the amount of the exposure light at the time of patterning through heightening of the opening ratio of the mesh structure installed for reinforcement of the pellicle film for EUV, which are considered as mutually conflicting; and the inventors came to realize that it was possible to improve the light transmittance of the pellicle for EUV without lowering the physical strength of the pellicle for EUV, by shaping the mesh structure in such a manner that, in a shape of longitudinal cross section (a shape of cross section in the height direction) of the grid, the width of the grid frame lessens as the distance from the silicon thin film is increased (See, FIGS. 6 and 7), that is to say it is a decreasing in width (hereinafter, described as "taper-like" in this specification), thereby achieving the present invention.

SUMMARY OF THE INVENTION

Problems to be Solved by the Invention

It is the object of the present invention among others to provide a pellicle for EUV, which has an increased strength while at the same time maintains unmitigated EUV light transmittance.

Means to Solve the Problems

The above object of the present invention was achieved by means of a pellicle for EUV having an EUV transmitting silicon film reinforced with a mesh structure, and this pellicle is characterized in that a grid of the mesh is formed as taper-like, wherein the taper-like means that the width of the grid frame lessens as the distance from the silicon thin film is increased.

In other word, the shape of longitudinal cross section (a shape of cross section in the height direction) of the grid, obtained by being cut with a plane perpendicular to the pellicle film as well as to a grid frame, is taper-like.

In the present invention, it is preferable that the inclination angle, which is formed by the side face of the grid frame and the vertical plane (This plane is the same as the surface of imagined vertical wall of the grid), lies in the range defined by $\alpha \times (1+/-0.3)$, wherein $\alpha$ is an incident angle of the exposure light which passes through the EUV transmitting film (Claim 2), and it is more preferable that the above inclination angle, (hereinafter described also as "taper angle"), lies in the range defined by $\alpha +/- 2$ degrees (Claim 3).

Effects of Invention

According to the present invention, it is possible to improve the light transmittance of the pellicle film for EUV while withholding the lowering of the physical strength of the pellicle for EUV.

SUMMARY OF INVENTION

Figure 1:
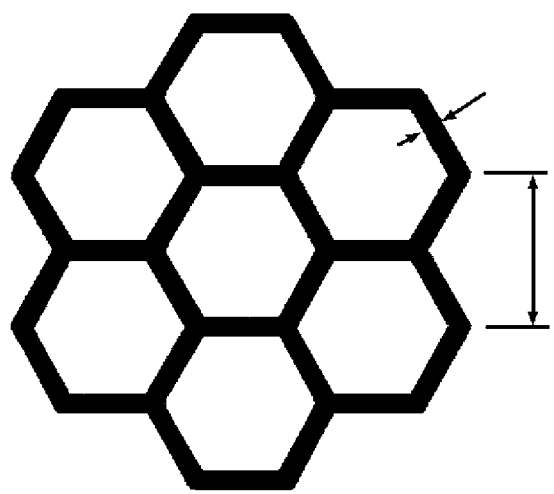
FIG. 1 This is a drawing to show a honeycomb-like reinforcement structure in a pellicle for EUV of the present invention.
Figure 2:
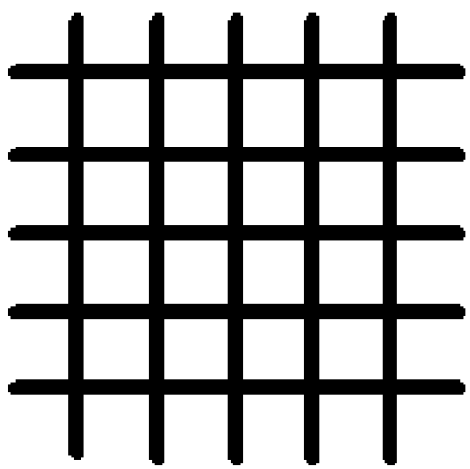
FIG. 2 This is a drawing to show a latticed reinforcement structure in a pellicle for EUV of the present invention.
Figure 3:
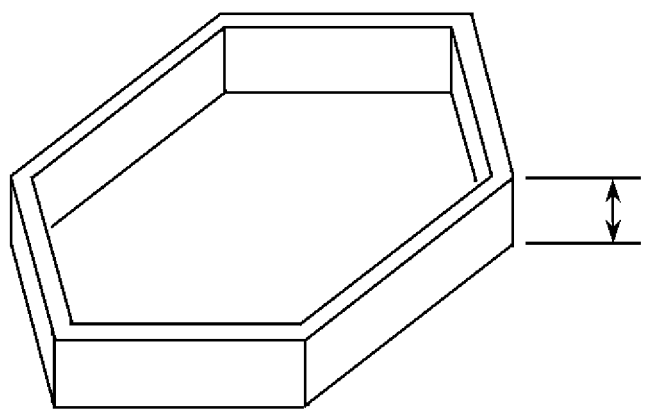
FIG. 3 This is a drawing to show a basic unit of the honeycomb-like structure in a pellicle for EUV of the present invention.
Figure 4:
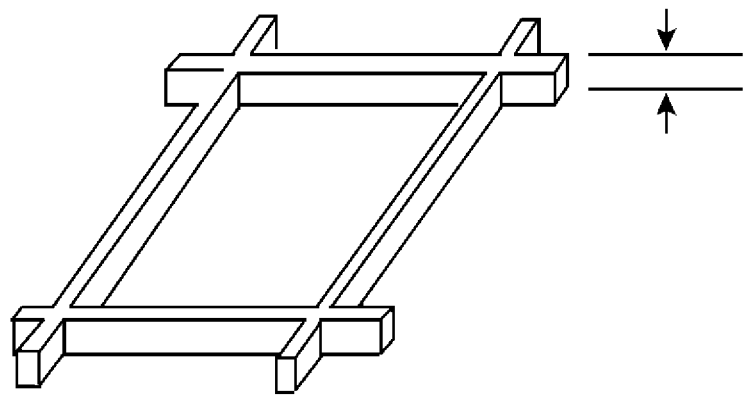
FIG. 4 This is a drawing to show a basic unit of the lattice in a pellicle for EUV of the present invention.

Hereinafter, the present invention will be described in more detail, but it should be understood that the invention is not to be construed as being limited in any way thereby.

The present invention proposes a pellicle for EUV having an EUV transmitting film and a mesh structure which supports and reinforces the EUV transmitting film, and this pellicle is characterized in that a shape of a longitudinal cross section of a grid frame, which constitutes the above mesh structure, is taper-like, that is, a width of the grid frame decreases as the distance from the EUV transmitting silicon thin film is increased.

The pellicle for EUV in an EUV scanner is coupled with an EUV mask, on which a lithography pattern is described, to form an EUV reticle. The EUV reticle is first positioned in such a manner that the EUV exposure light from an EUV light source hits one end part of the EUV reticle, and then the EUV reticle is moved in such a manner that the EUV light sweeps from that end part through the opposite end part, and next the EUV reticle is returned to the first position to be exposed to the light in the same manner and made to repeat the same movement over and over again. This one-way trip of the EUV reticle causes the EUV light to irradiate a wafer once, and the trip is repeated until when the sufficient number of times of light exposure, that is, the necessary number of times for the sufficient amount of light exposure to the wafer, can be obtained.

One round trip of the EUV reticle brings the EUV reticle back to its starting position and the next light exposure is started, and as such the EUV reticle repeats this round trip.

A scanner, which operates as a site production machine in a factory, is required to provide a higher yield. In order to do that, it is essential to increase the number of light exposure per unit time, and this is achieved by shortening the time required for the EUV reticle to complete its round trip motion.

When the time for the EUV reticle's round trip motion is shortened, the acceleration imposed on the EUV reticle would reach 6G to 10G, and this necessitates a design change for the EUV pellicle to withstand such a large acceleration.

It is possible to increase the strength of a pellicle for EUV by increasing the physical strength of the mesh structure that is used to support and reinforce the silicon thin film for EUV. To do so, in concrete terms, the width and/or height of the grid frame forming the mesh structure can be increased, and furthermore the mesh pitch can be reduced (See. FIGS. 1 through 4). However, to adopt any of these means would mean a reduction in the opening ratio of the mesh and as a result, the amount of the EUV light that passes through the pellicle for EUV is lessened. For this reason, it becomes necessary to design a pellicle for EUV which can pass greater amount of light through it while maintaining a necessary physical strength.

On the other hand, in an EUV exposure apparatus, the EUV light emitted by the EUV light source is irradiated upon the EUV mask, and is reflected thereby, according to the pattern information in the EUV mask, and is focused on the wafer with a shadow in the shape of the pattern. On this occasion, a flux of the EUV light irradiated upon the EUV mask enters the EUV mask at an incident angle of 4-6 degrees, and also the flux of the light reflected by the EUV mask reflects at an angle of reflection of 4-6 degrees.

Figure 6:
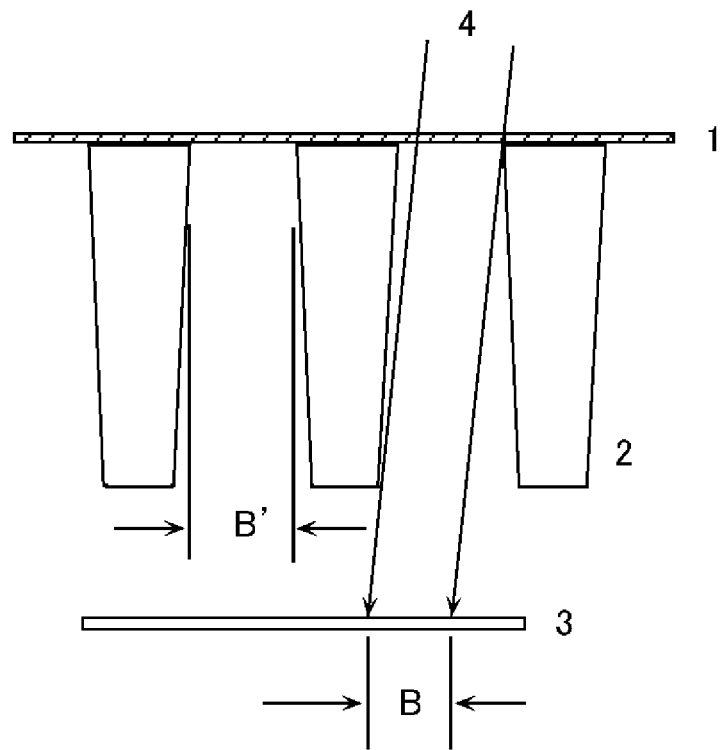
FIG. 6 This is a drawing to illustrate how an incoming light is blocked in the case of a pellicle for EUV of the present invention.

As described above, a light passes through the pellicle for EUV twice when it enters the pellicle and then reflects off the pellicle, and since the entering and reflecting lights have an angle of incidence and an angle of reflection respectively, some of the EUV light collides with the side faces of the grid frame of the mesh structure of the EUV pellicle. Owing to this collision upon the side faces of the grid frame, the amount of effective exposure light is reduced. However, if the grid frame is made to have a tapered width, it is possible to increase the transmittance without substantially lowering the physical strength of the pellicle (See. FIG. 6).

Figure 7:
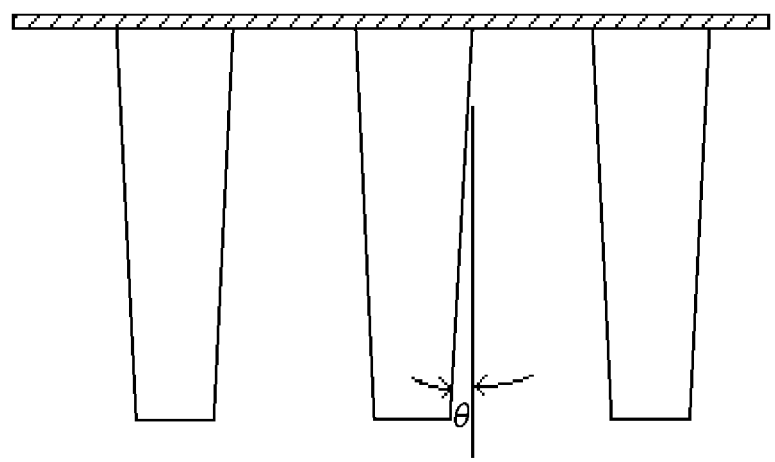
FIG. 7 This is a shape of longitudinal cross section (a shape of cross section in the height direction) of a pellicle for EUV of the present invention, when the pellicle is cut with a plane perpendicular to the pellicle film as well as to a grid frame.

Theoretically speaking, if the angle θ (See. FIG. 7), by which the side face of the (grid) frame of the mesh structure is slanted from the vertical plane (This plane is the same as the surface of imagined vertical wall of the grid), is made equal to the angle of incidence (α) by which the illumination light mentioned above enters the EUV transmitting film, the maximum improvement in transmittance is obtained; however, a sufficient transmittance improvement is also expected even if the inclination angle θ of the side face of the frame of the mesh structure is within the range of α×(1+/−0.3). From a viewpoint of practicality of the present invention, it is particularly preferable to design the inclination angle θ of the side face of the grid frame which forms the mesh structure to be within the range of α+/−2 degrees.

In the present invention, the angle of incidence means an incident angle of light with respect to the surface of the EUV mask (which is deemed as parallel to the EUV transmitting film), and the inclination angle θ of the side face of the grid frame is the taper angle by which the side face of the tapered grid frame is slanted from the vertical plane to the EUV transmitting film.

Figure 5:
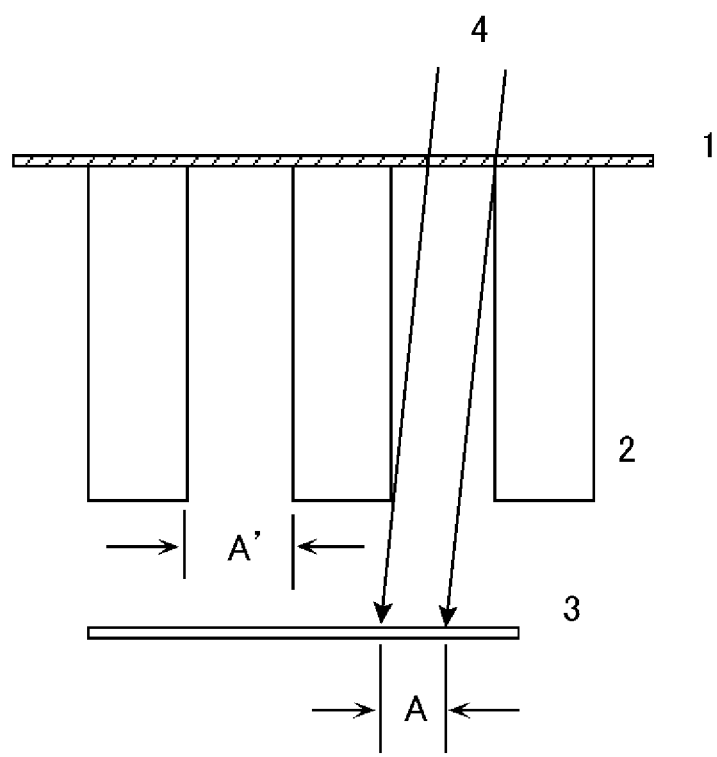
FIG. 5 This is a drawing to illustrate how an incoming light is blocked in the case of a conventional pellicle for EUV.

FIG. 5 is a longitudinal cross section of a conventional EUV pellicle and FIG. 6 is a longitudinal cross section of the EUV pellicle according to the present invention, respectively. In reality, the flux 4 of the EUV light is irradiated with a certain oblique angle to the mesh frame (grid frame) 2 which reinforces the EUV transmitting film 1. Owing to this angle of incidence, the width of the light flux that can pass through an opening of the mesh and reach the EUV mask 3 is less than the width of the light flux which is expected when the light enters the pellicle vertically, that is the width represented by A' (FIG. 5) and B' (FIG. 6). Comparing the irradiation width of A resulting from the conventional EUV pellicle (FIG. 5), wherein the longitudinal cross section of the grid frame 2 is rectangular, namely the wall surface of the grid frame is vertical to the EUV transmitting film, with the irradiation width of B resulting from the EUV pellicle according to the present invention (FIG. 6), wherein the longitudinal cross section of the grid frame 2 is tapered, B is clearly wider than A.

In an actual EUV exposure apparatus, the irradiation light is illuminated against the EUV mask with some divergent angle, therefore, with respect to a light flux, there occur certain deviations toward a plus direction as well as a minus direction, but all in all, to represent the light flux as described above would not make much difference from the reality.

As for the shape of the mesh structure in the EUV pellicle of the present invention, any shape will do so long as the resultant pellicle strength and EUV light transmission reach the target values, but it is rational to choose a shape wherein a single basic unit shape can fill in a plane, like honeycomb, lattice and the like. In the present invention, it is more preferable to select the honeycomb shape, since it can afford a combination of high results in the transmittance and the physical strength.

As is shown in FIG. 7, it is necessary that the mesh structure of the pellicle for EUV of the present invention has openings looking in the direction of the light source of the exposure light equipment and that the longitudinal cross section of the mesh frames (a longitudinal cross section of the height direction) has tapered grid, namely the width of the grid frame becomes narrower as the distance from the EUV transmitting silicon thin film is increased.

The manufacture of the mesh structure can be achieved by means of any known technology such as the lithography technology in which the resist transmittance is controlled, a technology which utilizes the difference in etching velocity in the depth direction which occurs in the RIE (Reactive Ion Etching) technology, and MEMS (Micro Electro Mechanical Systems) technology.

The present invention will now be described in more detail referring to Examples and Comparative examples, but it should be understood that the invention is not to be construed as being limited in any way thereby.

Example 1

A pellicle film for EUV was manufactured in the following manner from an SOI (Silicon On Insulator) substrate, which comprises a handle base plate made of a silicon plate having a diameter of 200 mm and a thickness of 725 micrometers, and a thin film having a thickness of 100 nm made of a silicon single crystal (Nearly Perfect Crystal: NPC) scarcely containing crystal defects such as COP (Crystal Originated Particle), which is attached to the said handle base plate via a thermal oxide film ($SiO_2$) having a thickness of 150 nm.

The handle base plate of the above described SOI substrate was thinned to a thickness of 50 micrometers, and thereafter a honeycomb structure pattern was printed on the handle base plate side of the SOI substrate by lithographic patterning, and then by means of DRIE (Deep Reactive Ion Etching) a honeycomb structure was created wherein each honeycomb basic unit consisting of a hexagonal frame has its interior angles rounded.

The said honeycomb structure had a pitch of 200 micrometers, a honeycomb frame width of 25 micrometers, and a honeycomb frame height of 75 micrometers.

Next, a film of BOX (Buried Oxide) was removed by HF treatment, and a pellicle film for EUV was completed. The taper angle θ of the frame of the supportive honeycomb structure of this EUV pellicle film, as measured in a manner shown in FIG. 7, was one degree.

Example 2

A pellicle film for EUV was made in the same manner as in Example 1. The taper angle θ of the frame of the honeycomb structure of this EUV pellicle film was 3.5 degrees.

Example 3

A pellicle film for EUV was made in the same manner as in Example 1. The taper angle θ of the frame of the honeycomb structure of this EUV pellicle film was 4.5 degrees.

Example 4

A pellicle film for EUV was made in the same manner as in Example 1, except that in place of DRIE (Deep Reactive Ion Etching), a more usual RIE method was used for etching whereby the etching depth and the etching velocity were altered. The taper angle θ of the frame of the supportive honeycomb structure of this EUV pellicle film was 6 degrees.

Example 5

A pellicle film for EUV was made in the same manner as in Example 4. The taper angle θ of the frame of the supportive honeycomb structure of this EUV pellicle film was 7.5 degrees.

Example 6

A pellicle film for EUV was made in the same manner as in Example 1. The taper angle θ of the frame of the supportive honeycomb structure of this EUV pellicle film was 8.5 degrees.

A frame of an aluminum alloy having 150 mm in length, 125 mm in width, and 1.5 mm in thickness was bonded respectively to each one of the above described six pellicle films for EUV after being cut to the same size as the frame, by means of water glass, whereby pellicles for EUV were prepared.

<EUV Transmittance Measurement Test>

The thus prepared six pellicles for EUV were set on an EUV transmittance measurement equipment in such a manner that the light passes the film at a slant angle of 6 degrees from the perpendicular line to the film (the incident angle to the EUV pellicle film was 6 degrees), and after evacuating the interior of the equipment, an EUV light was irradiated to measure the transmittance of the pellicles for EUV. The results are shown in Table 1.

<Vibration Test>

The frame of each one of the six EUV pellicles was attached to a transparent acrylic box for the vibration test via a double-sided adhesive tape. Then, the acrylic box, to which the EUV pellicle frame is attached, was set on the vibration table of a vibration test equipment, and the vibration table was vibrated with sinusoidal vibrato, while the interior of the acrylic box was kept evacuated with a rotary vacuum pump.

While the acceleration of the sinusoidal vibrato was increased, the vibration was carried on, and the acceleration value was measured at which the pellicle film for EUV was ripped. The results are shown in Table 1.

TABLE 1

|  | Taper angle (degrees) | Transmittance (%) | Acceleration at which film was ripped (G) |
| --- | --- | --- | --- |
| Example 1 | 1 | 80.2 | 25 |
| Example 2 | 3.5 | 80.3 | 25 |
| Example 3 | 4.5 | 82.2 | 28 |
| Example 4 | 6 | 82.5 | 26 |
| Example 5 | 7.5 | 83.3 | 25 |
| Example 6 | 8.5 | 83.8 | 20 |

Comparative Example

The honeycomb structure having a taper angle θ of zero degree (that is, as shown in FIG. 5, a longitudinal cross section of the honeycomb frame was rectangular) was made in the same manner as in Example 1 and also a pellicle for EUV was made in the same manner as in Example 1. After that, the transmittance measurement and the vibration test were carried out in the same manner as in Example 1. The results were that the transmittance was 79.8% and the acceleration at which the film was ripped was 25 G.

It was confirmed that although the pellicle for EUV in Examples from 1 to 6 of the present invention is similar to the conventional pellicle for EUV, which is used in Comparative example, in the acceleration at which the film was ripped, the transmittance was improved.

From the above results, it was confirmed that, since the pellicle for EUV according to the present invention had a taper angle at grid frames of the mesh structure, in an optimum range, its transmittance was improved, regardless of the fact that its physical strength was not decreased.

INDUSTRIAL APPLICABILITY

The pellicle for EUV according to the present invention is equipped with a film-supportive mesh structure which has an opening ratio higher than that of the conventional counterparts while maintaining sufficient physical strength, so that when a very thin film is used to make an EUV pellicle, the film is hard to be ripped, and hence the pellicle can be used effectively for the patterning of the semiconductor devices, etc. and thus the present invention is extremely useful industrially.

EXPLANATION OF LETTERS OR NUMERALS

1: EUV transmitting film
2: Grid of the Mesh
3: EUV mask
4: Luminous flux of EUV light
A and B: Irradiated areas
A' and B': Openings of mesh

What is claimed is:

1. A pellicle comprising an EUV transmitting silicon film reinforced with a mesh work structure having grid frames, wherein the grid frames of the mesh work structure are tapered such that the width of each grid frame is lessened as the distance from the silicon film is increased and wherein the taper angle θ, which is formed by a side face of the grid frame and an imaginary vertical wall of the grid frame, lies within the range defined by α×(1+/−0.3), where α is an angle of incidence by which an exposure light passes through the EUV transmitting silicon film.

2. The pellicle for EUV of claim 1 wherein the taper angle θ lies within the range defined by α+/−2 degrees.

3. The pellicle for EUV of claim 1 wherein the taper angle θ lies within the range from 1 to 8.5 degrees.

* * * * *